United States Patent
Kim et al.

(10) Patent No.: US 7,837,790 B2
(45) Date of Patent: Nov. 23, 2010

(54) FORMATION AND TREATMENT OF EPITAXIAL LAYER CONTAINING SILICON AND CARBON

(75) Inventors: Yihwan Kim, Milpitas, CA (US); Arkadii V. Samoilov, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1026 days.

(21) Appl. No.: 11/566,031

(22) Filed: Dec. 1, 2006

(65) Prior Publication Data

US 2008/0132018 A1     Jun. 5, 2008

(51) Int. Cl.
*C30B 29/38*     (2006.01)

(52) U.S. Cl. .................... 117/4; 117/8; 117/9; 117/105; 117/109; 117/201

(58) Field of Classification Search .......... 117/4, 117/8, 9, 105, 109, 201
See application file for complete search history.

(56) References Cited

U.S. PATENT DOCUMENTS

| | | | |
|---|---|---|---|
| 5,108,792 | A | 4/1992 | Anderson et al. |
| 5,177,677 | A | 1/1993 | Nakata et al. |
| 5,186,718 | A | 2/1993 | Tepman et al. |
| 6,740,585 | B2 * | 5/2004 | Yoon et al. ............ 438/680 |
| 6,803,297 | B2 | 10/2004 | Jennings et al. |
| 6,821,825 | B2 | 11/2004 | Todd et al. |
| 6,897,131 | B2 | 5/2005 | Ramachandran et al. |
| 6,916,398 | B2 | 7/2005 | Chen et al. |
| 6,998,153 | B2 | 2/2006 | Chiang et al. |
| 7,132,338 | B2 | 11/2006 | Samoilov et al. |
| 2004/0020601 | A1 * | 2/2004 | Zhao et al. ............ 156/345.32 |
| 2004/0224089 | A1 | 11/2004 | Singh et al. |
| 2005/0079691 | A1 | 4/2005 | Kim et al. |
| 2006/0115933 | A1 | 6/2006 | Ye et al. |
| 2006/0115934 | A1 | 6/2006 | Kim et al. |
| 2006/0216876 | A1 | 9/2006 | Kim et al. |
| 2006/0234488 | A1 | 10/2006 | Kim et al. |
| 2006/0240630 | A1 | 10/2006 | Bauer et al. |

OTHER PUBLICATIONS

Mitchell, T. O., et al., "Substitutional Carbon Incorporation in Epitaxial Si1-yCy Layers Grown by Chemical Vapor Deposition", *Appl. Phys. Lett.* 71(12), (Sep. 22, 1997),1688-1690.
Bauer, M., "Tensile Strained Selective Carbon Alloys for Recessed Source Drain Areas of Devices", *Abstract 210th ECS Meeting Oct. 29 through Nov. 3, 2006.*

* cited by examiner

*Primary Examiner*—Robert M Kunemund
(74) *Attorney, Agent, or Firm*—Diehl Servilla LLC

(57) ABSTRACT

Methods and apparatus for formation and treatment of epitaxial layers containing silicon and carbon are disclosed. Treatment of the epitaxial layer converts interstitial carbon to substitutional carbon. Specific embodiments pertain to the formation and treatment of epitaxial layers in semiconductor devices, for example, Metal Oxide Semiconductor Field Effect Transistor (MOSFET) devices. In specific embodiments, the treatment of the epitaxial layer involves annealing for short periods of time, for example, by laser annealing, millisecond annealing, rapid thermal annealing, and spike annealing in a environment containing nitrogen.

15 Claims, 3 Drawing Sheets

FORMATION AND TREATMENT OF EPITAXIAL LAYER CONTAINING SILICON AND CARBON

BACKGROUND

Embodiments of the present invention generally relate to formation and treatment of epitaxial layers containing silicon and carbon and apparatus therefor. Specific embodiments pertain to the formation and treatment of epitaxial layers in semiconductor devices, for example, Metal Oxide Semiconductor Field Effect Transistor (MOSFET) devices.

Typically, a Metal Oxide Semiconductor (MOS) transistor includes a semiconductor substrate, a source, a drain, and a channel positioned between the source and drain on the substrate, which is usually made from silicon. Normally, a gate stack is located above the channel, the gate stack being composed of a gate oxide layer or gate electrode located directly above the channel, a gate conductor material above the gate oxide layer, and sidewall spacers. The sidewall spacers protect the sidewalls of the gate conductor. The gate electrode is generally formed of doped polysilicon (Si) while the gate dielectric material may comprise a thin layer (e.g., <20 Å) of a high dielectric constant material (e.g., a dielectric constant greater than 4.0) such as silicon dioxide ($SiO_2$) or N-doped silicon dioxide, and the like.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers, which may be complementary to the compressively strained SiGe channel in a pMOS transistor. Thus, carbon-doped silicon and silicon-germanium epitaxial layers can be deposited on the source/drain of nMOS and pMOS transistors, respectively. The source and drain areas can be either flat or recessed by selective Si dry etching. When properly fabricated, nMOS sources and drains covered with carbon-doped silicon epitaxy imposes tensile stress in the channel and increases nMOS drive current.

To achieve enhanced electron mobility in the channel of nMOS transistors having a recessed source/drain using carbon-doped silicon epitaxy, it is desirable to selectively form the carbon-doped silicon epitaxial layer on the source/drain either through selective deposition or by post-deposition processing. Furthermore, it is desirable for the carbon-doped silicon epitaxial layer to contain substitutional C atoms to induce tensile strain in the channel. Higher channel tensile strain can be achieved with increased substitutional C content in a carbon-doped silicon source and drain. However, most of C atoms incorporated through typical selective Si:C epitaxy processes (for example at process temperature >700° C.) occupy non-substitutional (i.e. interstitial) sites of the Si lattice. By lowering growth temperature, a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures.

Therefore, there is a need to provide methods and apparatus to improve the substitutional carbon content in carbon-doped silicon epitaxial layers. Such methods would be useful In the manufacture of transistor devices.

SUMMARY OF THE INVENTION

One embodiment of the present invention relates to methods of forming and processing epitaxial layers containing silicon and carbon. Other embodiments relate to methods manufacturing of fabricating transistor devices including epitaxial layers containing silicon and carbon.

In accordance with one embodiment of the present invention, a method of treating an epitaxial layer containing silicon and carbon on a substrate is provided, which comprises providing a substrate having an epitaxial layer containing carbon and silicon deposited on the substrate, the carbon including interstitial carbon; and nitridating the substrate and epitaxial layer from about 800° C. to about 1350° C. to convert at least a portion of the interstitial carbon to substitutional carbon. In one embodiment, the nitridating comprises rapid thermal processing the substrate in an atmosphere containing oxygen, nitrogen or combinations thereof. According to an embodiment, the rapid thermal processing is performed in a nitrogen-containing atmosphere or an oxygen-containing atmosphere at a temperature of at least about 800° C. In one or more specific embodiments, the rapid thermal processing is performed in $NH_3$ or $O_2$ at a temperature of at least about 800° C.

According to one or more embodiments, the annealing can be performed by annealing the substrate for a short period time, for example, about three minutes or less. In one or more embodiments, the anneal can be performed by dynamic surface annealing, laser annealing, millisecond annealing, flash annealing or spike annealing. In one or more embodiments, the annealing occurs for less than about 10 seconds. In other embodiments, the annealing occurs for less than about 900 milliseconds. For example, the annealing may be performed by laser annealing or millisecond annealing for less than about 900 milliseconds. The laser annealing could be performed for shorter time periods, for example, less than about 900 nanoseconds.

The methods of the present invention may be a fabrication step of transistor manufacturing process. Embodiments of the invention pertain to a method of manufacturing a transistor comprising forming a gate dielectric on a substrate; forming a gate electrode on the gate dielectric; forming source/drain regions on the substrate having a second conductivity on opposite sides of the electrode and defining a channel region between the source/drain regions; depositing an epitaxial layer containing silicon and carbon directly on the source/drain regions, the carbon including interstitial carbon; and nitridating the substrate and epitaxial layer at a temperature from about 800° C. to about 1350° C. to convert at least a portion of the interstitial carbon in the epitaxial layer to substitutional carbon. In certain embodiments, the combined total amount of substitutional carbon and interstitial carbon is greater than about 2 atomic percent.

The nitridating may comprise rapid thermal processing the substrate in an atmosphere containing oxygen, nitrogen or combinations thereof. The annealing may be performed by one or more of dynamic surface annealing, laser annealing, millisecond annealing, flash annealing or spike annealing. Variations of annealing described above may be utilized to manufacture a transistor.

Another aspect of the invention pertains to an apparatus for forming epitaxial films containing silicon and carbon. According to one embodiment, the apparatus includes a first chamber including gas lines connected to carbon-containing gases and silicon-containing gases and configured to form an epitaxial layer on a substrate contained within the first chamber; and a second chamber connected to the first chamber including a gas line connected to a nitrogen-containing gas and configured to heat the substrate to a temperature from about 800° C. to about 1350° C.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart form the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
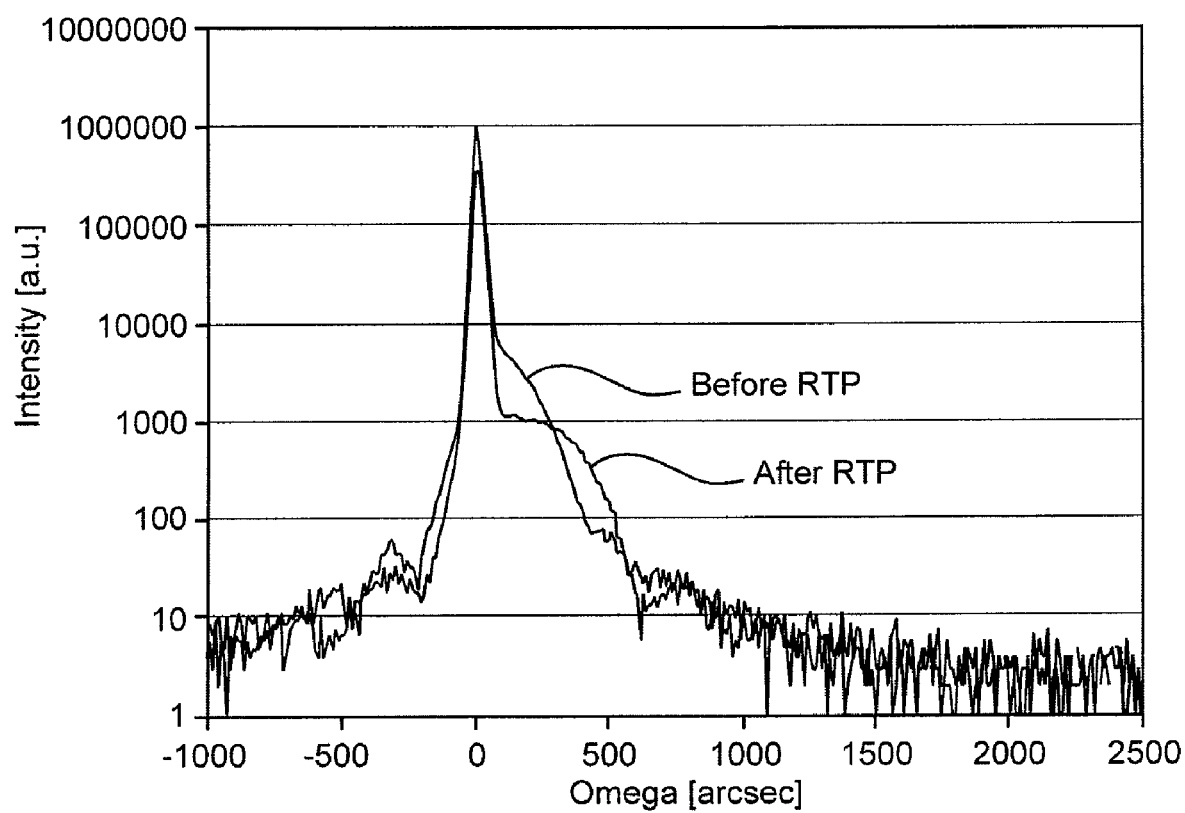
FIG. 1 is a high resolution X-ray diffractometer (HR-XRD) spectra of epitaxial layers containing silicon and carbon for as-deposited (control), spike annealed, rapid thermal processed in $NH_3$ at 850° C. silicon carbon epitaxial layers.

Embodiments of the invention generally provide a method of forming and treating an epitaxial layer containing silicon and carbon. Other embodiments pertain to a method of manufacturing a transistor.

The method of forming and treating an epitaxial layer comprises providing a substrate having an epitaxial layer containing carbon and silicon deposited on the substrate the carbon including interstitial carbon and annealing the substrate and epitaxial layer at a temperature from about 800° C. to about 1350° C. to convert interstitial carbon in the epitaxial layer to substitutional carbon. In one embodiment, the method of manufacturing a transistor comprises forming a gate dielectric on a substrate; forming a gate electrode on the gate dielectric; forming source/drain regions on the substrate having a second conductivity on opposite sides of the electrode and defining a channel region between the source/drain regions; depositing an epitaxial layer containing silicon and carbon directly on the source/drain regions and annealing the substrate and epitaxial layer at a temperature from about 800° C. to about 1350° C. to increase the amount of substitutional carbon and to reduce the amount of interstitial carbon (it present) in the epitaxial layer.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

According to embodiments of the invention, the processing of the epitaxial films containing carbon and silicon increases substitutional C content of the film. Substitutional C content in the Si:C layer can be increased by converting as-deposited non-substitutional C atoms to substitutional Si lattice sites. Although the present invention is not intended to be bound by any particular theory, it is believed that such conversion of non-substitutional (or interstitial) C atoms to substitutional sites may be related to distribution of point defects such as vacancies, self interstitials, and other foreign interstitials as well as defect clusters. By changing initial (as-deposited) defect distribution and Si lattice to a structure favorable for more C atoms to occupy substitutional sites, the substitutional C content can be increased. It will be understood that reference to increasing the amount of substitutional carbon is not intended to limit the invention to as-deposited films that containing substitutional carbon. According to embodiments of the invention, the initially deposited epitaxial film may contain no substitutional carbon, and according to embodiments of the present Invention, the film comprising interstitial carbon is treated to reduce the amount of interstitial carbon and to increase the substitutional carbon from zero in the as-deposited film. Such structural change and increase in substitutional C content can be achieved by the process sequences described herein.

According to an embodiment of the invention, the epitaxial layer containing silicon and carbon is heat treated under oxygen-containing and/or nitrogen-containing atmosphere, which will change the substitutional carbon concentration in the layer. Also, the epitaxial layer containing silicon and carbon may be treated under plasma with various species to change the substitutional carbon concentration. For example, a nitrogen-containing gas can be activated with plasma to result in nitridation of the epitaxial layer and change the substitutional carbon concentration. A non-limiting example of a plasma nitridation process is described in commonly assigned U.S. Pat. No. 6,998,153. In one embodiment, a nitrogen-containing gas, for example, nitrogen gas, can be first converted to a plasma. The plasma can be generated within the heating chamber, or it can be generated remotely or quasi-remotely, such as where a separate plasma formation chamber is attached to and opens into the process chamber. The plasma can then be directed into the nitridation chamber to flow over a surface of a substrate to undergo nitridation. Radio frequency (RF) energy can be generated that is capable of converting the gas into a plasma using an inductively coupled RF source generator electrically connected to transducers that are capable of applying RF energy within the process chamber. As a result, the nitrogen-containing gas are converted to an ionic form, i.e. the plasma.

Referring now to the Figures, FIG. 1 is a high resolution X-ray diffraction spectra, which shows an increase of substitutional carbon concentration after thermal treatment in $NH_3$ atmosphere. A first control sample contained 0.2% substitutional carbon as determined by high resolution x-ray diffractometry. A second sample was treated in a rapid thermal processing chamber. The second sample was processed in $NH_3$ at 850° C. for three minutes under 600 torr of pressure. With reference to FIG. 1, a shoulder at the right side of the Si peak at 34.5 degrees corresponds to a silicon layer containing carbon because substitutional carbon decreases lattice spacing of the carbon-containing epitaxial layer grown pseudomorphically on a Si substrate. The larger distance between the carbon-containing peak and the Si substrate peak indicates higher substitutional carbon concentration. The sample processed at 850° C. showed optimal results. The substitutional carbon increased by about 0.1 to 0.2%. While the present invention should not be limited by a particular theory, in a nitrogen-containing atmosphere, such as $NH_3$, Si vacancies will be generated, which helps carbon atoms to move to substitutional sites from interstitial sites. Observations in an oxygen-containing atmosphere show that Si self interstitials are generated, which move the substitutional carbons to interstitial sites.

According to embodiments of the present invention, the substrate upon which the epitaxial film is deposited is typically a silicon substrate, and it can be a patterned substrate. Patterned substrates are substrates that include electronic features formed into or onto the substrate surface. The patterned substrate may contain monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

The silicon carbon layer may be deposited using an epitaxial process in a suitable processing chamber such as an Epi RP or Centura, both of which are available from Applied Materials, Santa Clara, Calif. Generally, the process chamber is maintained at a consistent temperature throughout the epitaxial process. However, some steps may be performed at varying temperatures. The process chamber is kept at a temperature in the range from about 250° C. to about 1,000° C., for example, from about 500° C. to about 900° C. The appropriate temperature to conduct the epitaxial process may depend on the particular precursors used to deposit and/or etch the silicon and carbon-containing materials, and can be determined by a person skilled in the art. The process chamber is usually maintained at a pressure from about 0.1 Torr to about 200 Torr. The pressure may fluctuate during and between this deposition step, but is generally constant.

During the epitaxial deposition process, the substrate is exposed to a deposition gas to form an epitaxial layer on the monocrystalline surface while forming a polycrystalline layer on the secondary surfaces. The specific exposure time of the deposition process is determined in relation to the exposure time during the etching process, as well as particular precursors and temperature used in the process. Generally, the substrate is exposed to the deposition gas long enough to form a maximized thickness of an epitaxial layer while forming a minimal thickness of a polycrystalline layer that may be easily etched away during deposition.

The deposition gas contains at least a silicon source, a carrier gas, and a carbon source. In an alternative embodiment, the deposition gas may include at least one etchant, such as hydrogen chloride or chlorine.

The silicon source is usually provided into the process chamber at a rate in a range from about 5 sccm to about 500 sccm, for example, from about 10 sccm to about 300 sccm, and specifically from about 50 sccm to about 200 sccm, more specifically, about 100 sccm. Silicon sources useful in the deposition gas to deposit silicon and carbon-containing compounds include, but not limited to, silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

The silicon source is usually delivered into the process chamber along with a carrier gas. The carrier gas has a flow rate from about 1 slm (standard liters per minute) to about 100 slm, for example, from about 5 slm to about 75 slm, and specifically from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process 120. Usually the carrier gas is the same throughout each step. However, some embodiments may use different carrier gases in particular steps.

The carbon source provided to the process chamber during step 120 with the silicon source and carrier gas to form a silicon and carbon-containing compound, such as a silicon carbon material, is usually provided into the process chamber at a rate in the range from about 0.1 sccm to about 20 sccm, for example, from about 0.5 sccm to about 10 sccm, and more specifically from about 1 sccm to about 5 sccm, for example, about 2 sccm. Carbon sources useful to deposit silicon and carbon-containing compounds include, but not limited to, organosilanes, alkyls, alkenes and alkynes of ethyl, propyl and butyl. Such carbon sources include methylsilane ($CH_3SiH_3$), dimethylsilane (($CH_3$)$_2SiH_2$), trimethylsilane (($CH3$)$3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 atomic %, for example, from about 1 atomic % to about 3 atomic %, more specifically at least about 2 atomic % or at least about 1.5 atomic %. In one embodiment, the carbon concentration may be graded within an epitaxial layer, preferably graded with a higher carbon concentration in the lower portion of the epitaxial layer than in the upper portion of the epitaxial layer. Alternatively, a germanium source and a carbon source may both be added into the process chamber with the silicon source and carrier gas to form a silicon and carbon-containing compound, such as a silicon germanium carbon material.

The deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process is immediately started without purging and/or evacuating the process chamber.

Etching

An optional etching process may be performed. The etching process removes a portion of the epitaxial layer on the substrate surface. The etching process removes both epitaxial or monocrystalline materials and amorphous or polycrystalline materials. Polycrystalline layers, if any, deposited on the substrate surface are removed at a faster rate than the epitaxial layers. The time duration of the etching process is balanced with the time duration of the deposition process to result in net deposition of the epitaxial layer selectively formed on desired areas of the substrate. Therefore, the net result of the deposition process and etching process to form selective and epitaxially grown silicon and carbon-containing material while minimizing, if any, growth of polycrystalline material.

During the etching process, the substrate is exposed to the etching gas for a period of time in the range from about 10 seconds to about 90 seconds, for example, from about 20 seconds to about 60 seconds, and more specifically from about 30 seconds to about 45 seconds. The etching gas includes at least one etchant and a carrier gas. The etchant is usually provided into the process chamber at a rate in the range from about 10 sccm to about 700 sccm, for example from about 50 sccm to about 500 sccm, The etchant used in the etching gas may include chlorine ($Cl_2$), hydrogen chloride (HCl), boron trichloride ($BCl_3$), methylchloride ($CH3Cl$), carbon tetrachloride ($CCl_4$), chlorotrifluoride ($ClF_3$) and combinations thereof. Preferably, chlorine or hydrogen chloride is used as the etchant.

The etchant is usually provided into the process chamber with a carrier gas. The carrier gas has a flow rate in the range from about 1 slm to about 100 slm, for example, from about 5 slm to about 75 slm, and more specifically from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. A carrier gas may be selected based upon specific precursor(s) and/or temperature used during the epitaxial process The etching process is terminated. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, the thickness of the epitaxial layer is immediately started without purging and/or evacuating the process chamber.

The thicknesses of the epitaxial layer and the polycrystalline layer may be determined. If the predetermined thicknesses are achieved, then epitaxial process is terminated. However, if the predetermined thicknesses are not achieved, then the deposition process is repeated as a cycle until the desired thicknesses are achieved. The epitaxial layer is usually grown to have a thickness at a range from about 10 Å to about 2,000 Å, for example, from about 100 Å to about 1,500 Å, and more specifically from about 400 Å to about 1,200 Å, for example, about 800 Å. The polycrystalline layer is usually deposited with a thickness, if any, in a range from an atomic layer to about 500 Å. The desired or predetermined thickness of the epitaxial silicon and carbon-containing layer or the polycrystalline silicon and carbon-containing layer is specific to a particular fabrication process. In one example, the epitaxial layer may reach the predetermined thickness while the polycrystalline layer is too thick.

Dopant Exposure

During epitaxial deposition, the epitaxial layer may optionally be exposed to a dopant. Typical dopants may include at least one dopant compound to provide a source of elemental dopant, such as boron, arsenic, phosphorous, gallium or aluminum. Dopants provide the deposited silicon and carbon-containing compounds with various conductive characteristics, such as directional electron flow in a controlled and desired pathway required by the electronic device. Films of the silicon and carbon-containing compounds are doped with particular dopants to achieve the desired conductive characteristic. In one example, the silicon and carbon-containing compound is doped p-type, such as by using diborane to add boron at a concentration in the range from about $10^{15}$ atoms/$cm^3$ to about $10^{21}$ atoms/$cm^3$. In one example, the p-type dopant has a concentration of at least $5 \times 10^{19}$ atoms/$cm^3$. In another example, the p-type dopant is in the range from about $1 \times 10^{20}$ atoms/$cm^3$ to about $2.5 \times 10^{21}$ atoms/$cm^3$. In another example, the silicon and carbon-containing compound is doped n-type, such as with phosphorous and/or arsenic to a concentration in the range from about $10^{15}$ atoms/$cm^3$ to about $10^{21}$ atoms/$cm^3$.

A dopant source is usually provided into the process chamber during step 130. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3)_3B$), dimethylborane (($CH_3)_2BH$), triethylborane (($CH_3CH_2)_3B$) and diethylborane (($CH_3CH_2)_2BH$). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$.

Annealing

According to one or more embodiments of the invention, the epitaxial layer treated by nitridation and/or oxygen can also be annealed. In specific embodiments, the annealing may take place for a relatively short period of time such as in a rapid thermal anneal or rapid thermal processing chamber. The period of time may be three minutes or less. As used herein, rapid thermal annealing (RTA) and rapid thermal processing (RTP) both refer to a process that subjects a sample to a very short yet highly controlled thermal cycle that heats the sample from room temperature to a high temperature, for example, as high as 1350° C. The duration of the thermal cycle during a RTP or RTA process is typically less than about 60 seconds, and typically less than about 30 seconds. In certain embodiments, the duration of the RTP or RTA is less than about 20 seconds, 15 seconds, 10 seconds, or 5 seconds. Spike annealing of flash annealing refers to a process in which a sample is exposed to high temperatures for less than about 10 seconds or 5 seconds. For example, a flash anneal or spike anneal may occur for less than about five seconds at high temperature of between about 800 degrees Celsius to 1200 degrees Celsius. Laser annealing or millisecond annealing refer to processes that subject a sample to a thermal cycle that heats the sample from room temperature to a high temperature, for example, as high as 1350° C., in less than about 900 milliseconds, and more typically less than about 500 milliseconds. As the name implies, laser annealing uses a laser to heat the sample.

The annealing process may include a rapid thermal process such as rapid thermal annealing, rapid thermal processing, laser annealing, millisecond annealing, and/or spike annealing or flash annealing or combinations thereof. The annealing temperature may depend on the process used. For example, spike annealing may have a temperature ranging between about 1000° C. and about 1100° C., preferably about 1050° C., while solid phase epitaxy may be performed at 500° C. or less.

The annealing process may include a spike anneal, such as rapid thermal process (RTP), laser annealing or thermal annealing with an atmosphere of gas, such as oxygen, nitrogen, hydrogen, argon, helium or combinations thereof. The annealing process is conducted at a temperature from about 800° C. to about 1200° C., preferably from about 1050° C. to about 1100° C. The annealing process may occur immediately after the silicon and carbon-containing layer is deposited or after a variety of other process steps the substrate will endure.

In one embodiment, spike annealing is performed in an RTP system capable of maintaining gas pressure in the annealing ambient at a level significantly lower than the atmospheric pressure. An example of such an RTP system is the RADIANCE CENTURA® system commercially available from Applied Materials, Inc., Santa Clara, Calif. Spike annealing is further discussed in commonly assigned U.S. Pat. No. 6,897,131, issued May 24, 2005, entitled ADVANCES IN SPIKE ANNEAL PROCESSES FOR ULTRA SHALLOW JUNCTIONS and commonly assigned U.S. Pat. No. 6,803,297, issued Oct. 12, 2004 entitled OPTIMAL SPIKE ANNEAL AMBIENT, which are herein incorporated by reference to the extent they do not conflict with the current specification and claims.

It has been observed that millisecond or laser annealing above 1000° C. in Applied Materials DSA chamber/system provided excellent results: Millisecond or laser annealing provides sufficient energy to bring non-substitutional C atoms back to substitutional sites to increase the substitutional carbon content of the epitaxial layer.

It has also been determined that adding a spike anneal step at temperature (rapid thermal annealing) up to 1050° C. in various gas atmospheres (e.g., $N_2$, $O_2$) after dynamic surface anneal, the substitutional C content in epitaxial layer is still maintained above the initial substitutional C % obtained from the epitaxial deposition process.

The processes of the invention can be carried out in equipment known in the art. The apparatus may contain multiple gas lines to maintain the deposition gases containing silicon and carbon and other process gases separated prior to entering the process chamber. Thereafter, the gases are brought into contact with a heated substrate on which the silicon and carbon-containing compound films are grown. In processes that utilize $NH_3$ and $H_2$, the gases may need to be provided by mutually exclusive lines via interlocks. Hardware that can be used to deposit silicon and carbon-containing films includes the Epi Centura® system available from Applied Materials, Inc., located in Santa Clara, Calif.

Another embodiment of the invention pertains to an apparatus for forming and thermally treating an epitaxial layer containing silicon and carbon. According to one embodiment, as noted above, epitaxial deposition can be carried out in a CENTURA® Reduced Pressure CVD System, available from Applied Materials, Inc., of Santa Clara, Calif. The CENTURA® system is a fully automated semiconductor fabrication system, employing a single wafer, multi-chamber, modular design, which accommodates a wide variety of wafer sizes. In addition to the CVD chamber, the multiple chambers may include a pre-clean chamber, wafer orienter chamber, epitaxial deposition chamber, annealing chamber, cooldown chamber, and independently operated loadlock chamber. Although the CVD chamber presented herein is shown in schematic in FIG. 2, other epitaxial deposition apparatus may be used according to embodiments of the present invention.

Figure 2:
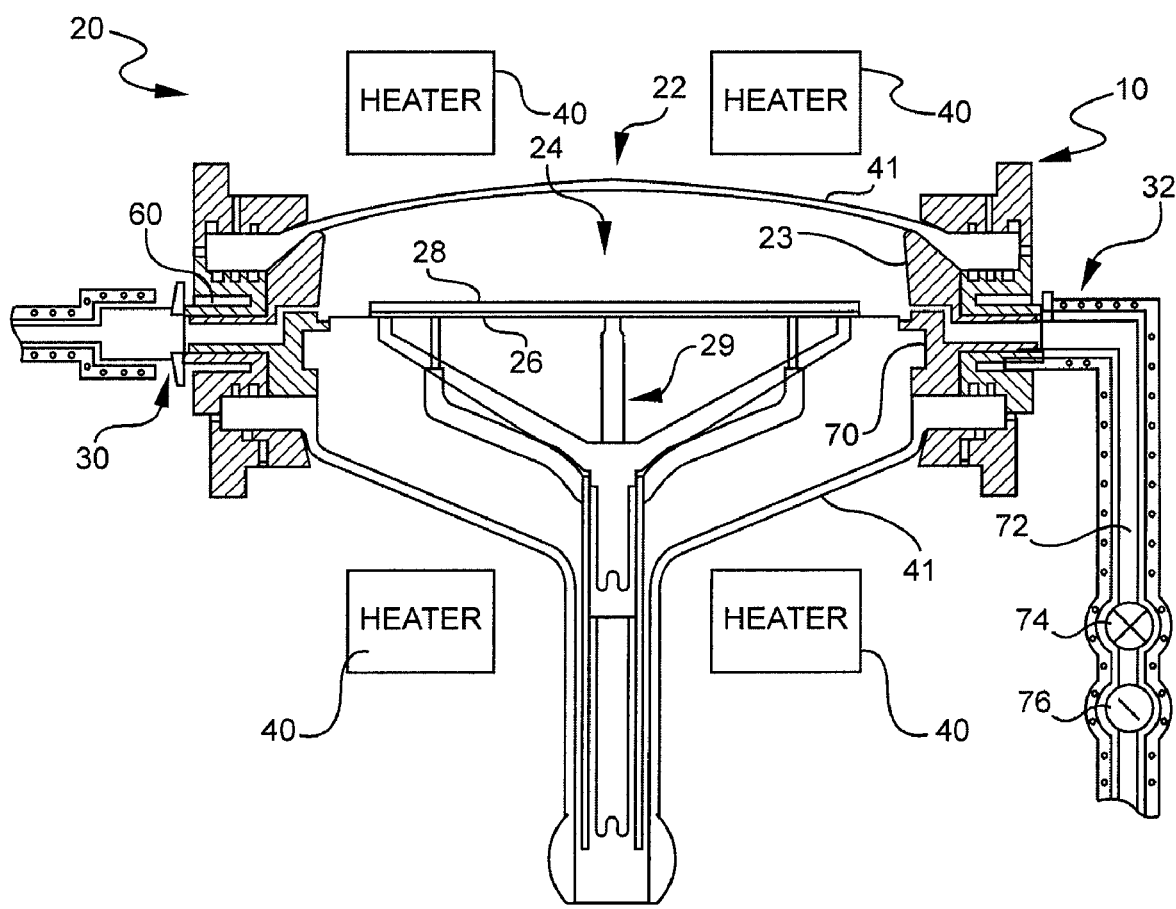
FIG. 2 shows a schematic view of an individual CENTURA® reduced pressure CVD apparatus used in accordance with embodiments of the present invention.

The equipment shown in the schematic of FIG. 2 is described in more detail in U.S. Pat. No. 5,108,792 to Anderson et al., the entire contents of which are incorporated herein by this reference. The apparatus 10 includes a housing 20 that encloses a deposition chamber 22 having a surrounding wall 23 that defines a deposition zone 24. A holder 26 within the deposition chamber 22 can hold a substrate 28 in the deposition zone 24. The holder 26 optionally comprises a drive assembly 29 that is provided for rotating the substrate 28 to enhance the uniformity of the deposited film. An inlet gas conduit 30 provides process gas to the deposition zone 24, and an exhaust gas conduit 32 exhausts process gas byproducts from the deposition zone 24.

A heater 40 in the housing 20 is provided for heating the substrate 28 held by the substrate holder 26. The heater 40 radiantly heats the deposition zone 24 through upper and lower quartz domes 41, and is preferably a symmetrical heater of the type described in U.S. Pat. No. 5,179,677, to Anderson et al., which is incorporated herein by reference. The gas exhaust conduit 32 preferably comprises an exhaust manifold 70 that connects an exhaust line 72 to the deposition chamber 22. The exhaust line 72 has an isolation valve 74 and a pressure control valve 76 therein.

Aspects of the invention may be carried out in a cluster tool. Generally, a cluster tool is a modular system comprising multiple chambers which perform various functions including substrate center-finding and orientation, degassing, annealing, deposition and/or etching. According to an embodiment of the present invention, a cluster tool includes an epitaxial deposition chamber coupled with an annealing chamber, for example, a RTP chamber or dynamic surface annealing chamber to anneal the substrate. The annealing chamber may be connected to a nitrogen source gas while the deposition chamber may be connected to a silicon-containing gas source and a carbon-containing gas source. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present cleaning process.

Figure 3:
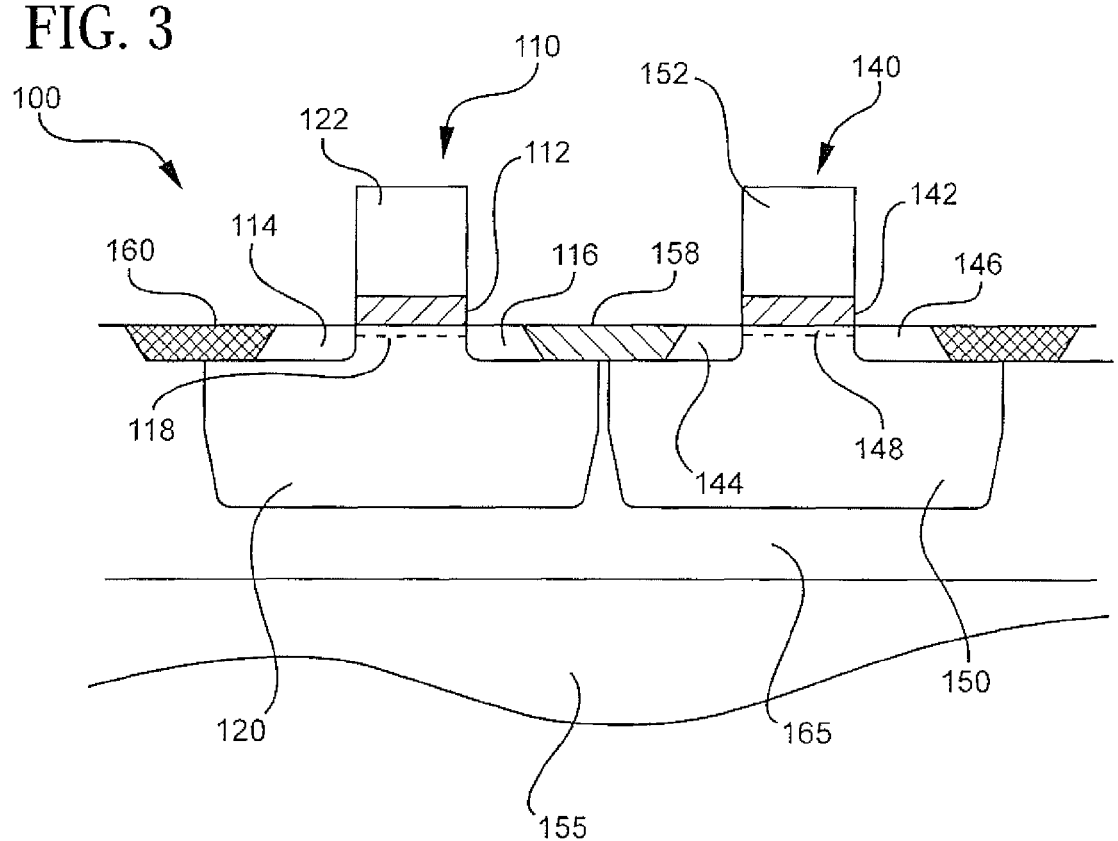
FIG. 3 is a cross-sectional view of a field effect transistor pair in accordance with an embodiment of the invention.

One or more embodiments of the present invention provide methods that are particularly useful in forming complementary metal oxide semiconductor (CMOS) integrated-circuit devices and will be described in that context. Other devices and applications are also within the scope of the invention. FIG. 3 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Processes for forming the NMOS gate electrode 122 and dielectric layer are known in the art and are not discussed further herein.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a N-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. It will be appreciated that the structures of the transistors 110 and 140 shown in FIG. 3 and described immediately above are exemplary only, and various variants in materials, layers, etc. are within the scope of the present invention.

Figure 4:
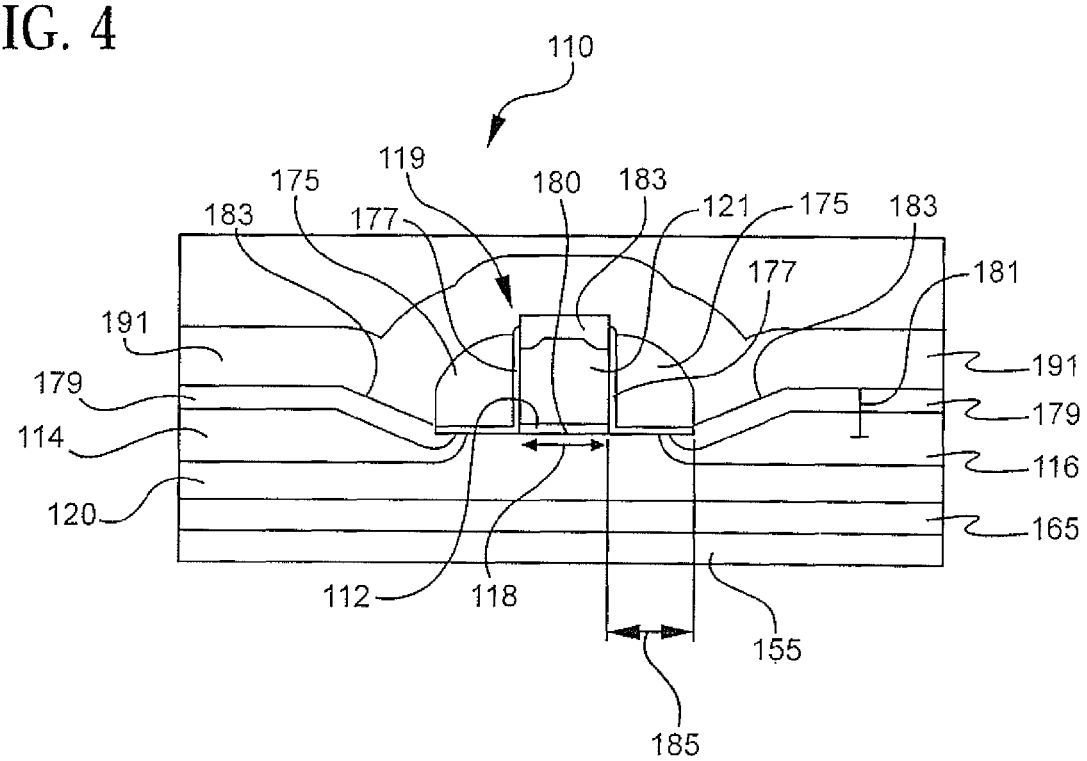
FIG. 4 is a cross-sectional view of the NMOS field effect transistor shown in FIG. 1 having additional layers formed on the device.

Referring now to FIG. 4, which shows a view of additional details of the NMOS device 110 of FIG. 3 after formation of spacers, layers over the source/drain regions, for example, silicide layers, and formation of the etch stop. It will be appreciated that the PMOS device shown in FIG. 3 may contain similar spacers and layers that may be tailored in dimensions and/or composition to affect the stress induced in the channel of the NMOS device as will be described further below. However, for illustration purposes, only NMOS device is shown and described in detail.

FIG. 4 shows spacers 175 that may be formed from suitable dielectric material incorporated around the gate 119. Offset spacers 177 may also be provided, which surround each of the spacers 175. Processes for forming shapes, sizes, and thickness of spacers 175 and 177 are known in the art and are not further described herein. A metal silicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The silicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface As will be understood by the skilled artisan, the exemplary device described above may be modified to include a source/drain or source/drain extension having a Si:C epitaxial layer that may be further modified according to the methods described herein.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive, Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of forming an epitaxial layer containing Si and C on a substrate comprising:
providing a substrate having an epitaxial layer containing carbon and silicon deposited on the substrate, the carbon including interstitial carbon; and
nitridating the substrate and epitaxial layer at a temperature from about 800° C. to about 1350° C. in a nitrogen-containing gas to convert at least a portion of the interstitial carbon to substitutional carbon.

2. The method of claim 1, wherein the nitridating comprises rapid thermal processing the substrate in an atmosphere containing nitrogen.

3. The method of claim 2, wherein the rapid thermal processing is performed in $NH_3$ at a temperature of at least about 800° C.

4. The method of claim 2, further comprising annealing for about three minutes or less.

5. The method of claim 4, wherein annealing is performed by one or more of dynamic surface annealing, laser annealing, millisecond annealing, flash annealing or spike annealing.

6. The method of claim 5, wherein annealing occurs for less than 10 seconds.

7. The method of claim 5, wherein the annealing occurs for less than 900 milliseconds.

8. The method of claim 1, wherein the nitridating comprises treating the substrate by activating the nitrogen-containing gas with a plasma in a nitrogen-containing gas.

9. The method of claim 8, wherein the nitrogen-containing gas comprises $NH_3$.

10. The method of claim 1, wherein the Si:C epitaxial film is formed during a fabrication step of transistor manufacturing process and the method further comprises:
forming a gate dielectric on a substrate;
forming a gate electrode on the gate dielectric;
forming source/drain regions on the substrate on opposite sides of the electrode and defining a channel region between the source/drain regions; and depositing the epitaxial layer containing silicon and carbon directly on the source/drain regions, the carbon including interstitial carbon.

11. The method of claim 10, wherein the nitridating comprises rapid thermal processing the substrate in an atmosphere containing nitrogen.

12. The method of claim 10, wherein nitridating comprises one or more of dynamic surface annealing, laser annealing, millisecond annealing, flash annealing or spike annealing.

13. The method of claim 10, wherein nitridating occurs for less than three minutes.

14. The method of claim 10, wherein the nitridating comprises laser annealing or millisecond annealing for less than 900 milliseconds.

15. The method of claim 10, wherein the nitridating comprises exposing the epitaxial layer to a nitrogen-containing gas activated by a plasma.

* * * * *